Dec. 8, 1970 E. K. BEAUCHAMP ET AL 3,546,026

FIBER STRENGTHENED THERMOELECTRIC MATERIAL

Filed Sept. 20, 1968

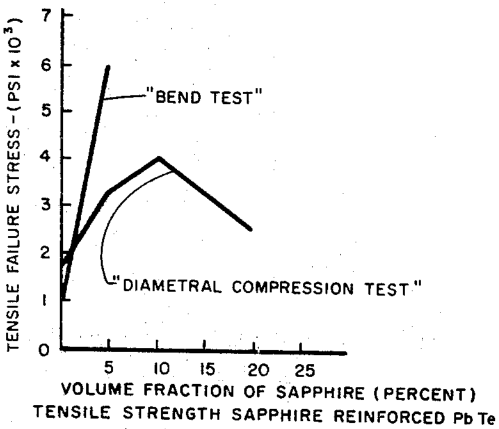

TENSILE STRENGTH SAPPHIRE REINFORCED Pb Te

Fig. 1

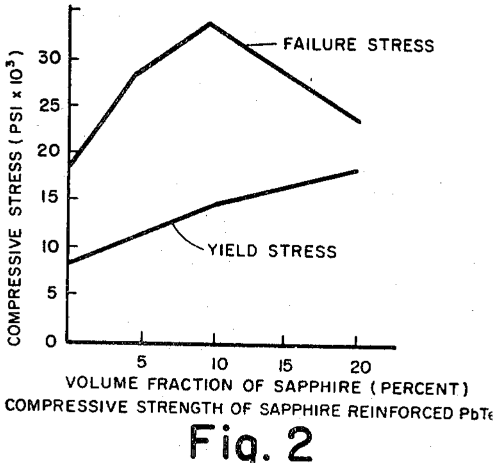

COMPRESSIVE STRENGTH OF SAPPHIRE REINFORCED PbTe

Fig. 2

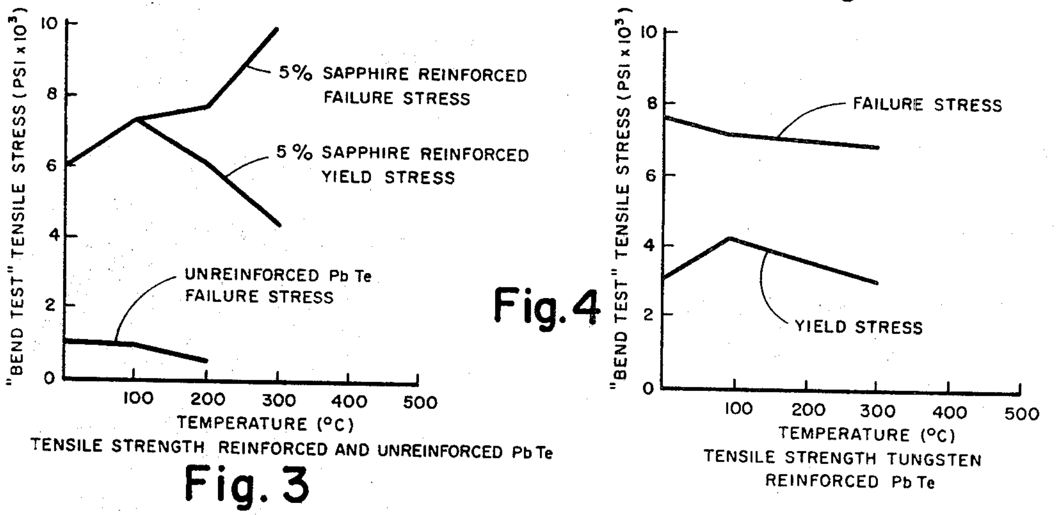

Fig. 3, Fig. 4

TENSILE STRENGTH REINFORCED AND UNREINFORCED Pb Te

TENSILE STRENGTH TUNGSTEN REINFORCED Pb Te

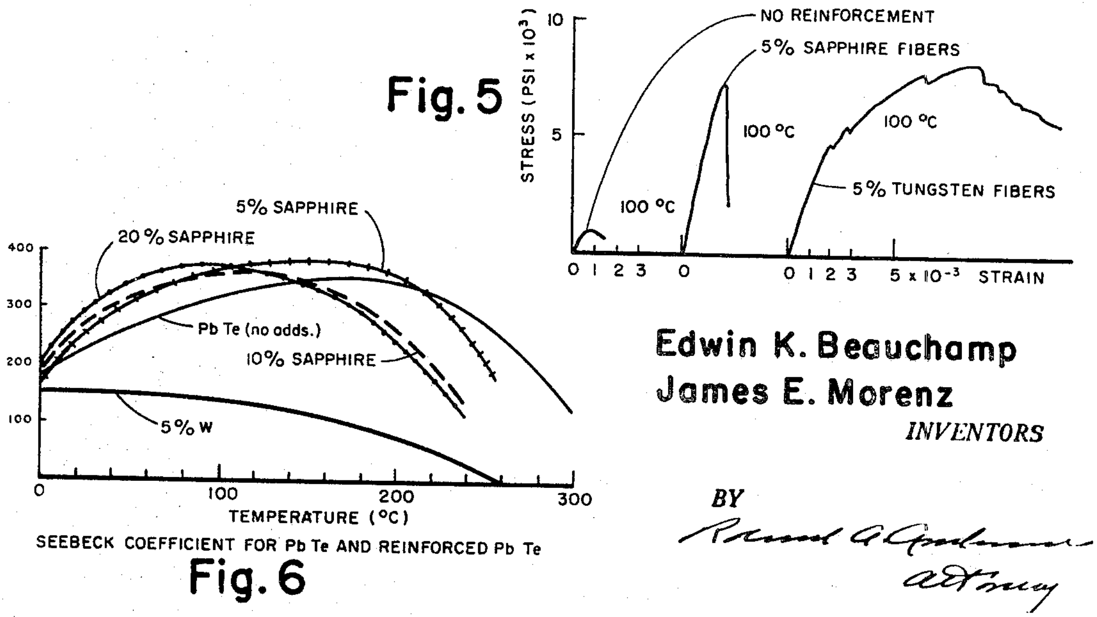

Fig. 5, Fig. 6

SEEBECK COEFFICIENT FOR Pb Te AND REINFORCED Pb Te

Edwin K. Beauchamp
James E. Morenz
*INVENTORS*

BY [signature]
Attorney

United States Patent Office 3,546,026

Patented Dec. 8, 1970

3,546,026

FIBER STRENGTHENED THERMOELECTRIC MATERIAL

Edwin K. Beauchamp and James E. Morenz, Albuquerque, N. Mex., assignors to the United States of America as represented by the United States Atomic Energy Commission Filed Sept. 20, 1968, Ser. No. 761,057

Int. Cl. H01l *3/00;* H01v *1/18*

U.S. Cl. 136—238 5 Claims

ABSTRACT OF THE DISCLOSURE

A thermoelectric element wherein the element includes a lead telluride thermoelectric composition and fibers having a Young's modulus of not less than about $60\times10^6$ p.s.i. evenly dispersed throughout said composition, the composition having a tensile failure strength of not less than about 6,000 p.s.i.

BACKGROUND OF INVENTION

Thermoelectric generators constitute an important source of electric power in the direct conversion of thermal energy to electrical energy. Lead telluride, because of its superior thermoelectric properties, is one of the most commonly used thermoelectric materials in these generators. Since commercial lead telluride has a very low mechanical strength with a tensile strength of about 1000 p.s.i. or less, thermoelectric generators using lead telluride elements have been subject to failure from element rupture or fracture under high or even moderate stress conditions, particularly tensile stress conditions. Such thermoelectric generators may be subjected to wide ranges of stresses from vibrations and other forces even under normal operating conditions in applications such as in space vehicles.

In attempting to overcome this weakness, most generator designs incorporate a spring compression contact to maintain electrical and thermal conduction. The spring provides a resilient suspension for the lead telluride element which may absorb or lessen stresses applied to the element. However, the spring suspension incurs both additional weight and size to the generator, which in space and other applications may be highly critical. Further, the thermal and electrical contact pressure may vary under mechanical loads as the compression spring absorbs all or a portion of the load or weakens with extended use resulting in a change in electrical characteristics or output.

SUMMARY OF THE INVENTION

In view of the limitations of the prior art as set forth above, it is an object of this invention to provide a thermoelectric element which has high mechanical strength.

It is a further object of this invention to provide a high strength lead telluride thermoelectric element having good thermoelectric properties.

Various other objects and advantages will appear from the following description of the invention, and the most novel features will be particularly pointed out hereinafter in connection with the appended claims.

The invention comprises a thermoelectric element wherein the element includes hot pressed lead telluride thermoelectric composition reinforced by fibers having a Young's modulus of not less than about $60\times10^6$ p.s.i., the fiber being evenly dispersed throughout said composition.

DESCRIPTION OF DRAWINGS

The mechanical and thermoelectric characteristics of the fiber strengthened lead telluride of this invention are shown in the following drawings wherein;

FIG. 1 is a graph of tensile strength vs. volume fraction of sapphire fibers in lead telluride;

FIG. 2 is a graph of compressive strength vs. volume fraction of sapphire fibers in lead telluride;

FIG. 3 is a graph of tensile strength vs. temperature for unreinforced and sapphire fiber reinforced lead telluride;

FIG. 4 is a graph of tensile strength vs. temperature of tungsten fiber reinforced lead telluride;

FIG. 5 is a graph showing stress-strain curves for unreinforced and reinforced lead telluride; and FIG. 6 is a graph of Seebeck coefficient vs. temperature for unreinforced and reinforced lead telluride.

DETAILED DESCRIPTION

Lead telluride, when formed in the proper configuration with appropriate doping impurities, exhibits a high Seebeck effect. Lead telluride is also characterized by being brittle and having relatively low tensile and compressure strengths and low Young's modulus. It has been discovered that lead telluride thermoelectric elements may be substantially strengthened and even self-supporting under high stress by the addition of certain fibers or whiskers at a prescribed, narrow range of volume percents without appreciable, and in some cases negligible, change in thermoelectric properties. In order to substantially strengthen lead telluride, it has been found that the fibers must be strong, having a Young's modulus greater than $60\times10^6$ p.s.i., and a length-to-diameter ratio of not less than about 50. Fibers or whiskers which were found to strengthen lead telluride to the desired tensile strength level without detrimental effects to thermoelectric properties include tungsten and sapphire fibers. Other fibers which may be used include silicon carbide. Tungsten fibers were used having a diameter of about 0.001 inch and lengths from about 0.05 to 0.2 inch. The sapphire fibers used had diameters from about 1 to 3 microns and lengths from about 500 to 5000 microns. Generally, the higher the length-to-diameter ratio and the more evenly or uniformly dispersed the fibers, the stronger the lead telluride-fiber composite.

FIGS. 1 through 5 show the mechanical strengths of unreinforced lead telluride and of compositions or composites of lead telluride reinforced with sapphire or tungsten fibers. The particular lead telluride material used in these tests was chosen so as to achieve maximum sensitivity to changes in thermoelectric properties resulting from additions of impurity materials. For pure lead telluride, which cannot have stoichiometric deviations in composition of more than a few hundredths of a percent, carrier or impurity cocentrations are limited to about $3\times10^{17}$ electrons or holes/cm.$^3$ and is extremely sensitive to contamination. Since synthesis of pure lead telluride is difficult to achieve, a material with slight tellurium excess (about 0.3 percent by weight) was selected which is a p-type thermoelectric material. The same thermoelectric material was used in all the tests shown in the drawings in both unreinforced and reinforced conditions.

As can be seen by reference to FIGS. 1 through 5, the reinforced compositions of pure lead telluride and fibers (with the above noted tellurium excess) exhibited substantially higher mechanical strength than the unreinforced lead telluride. Further, with reference to FIGS. 1 and 2, as the volume fraction of sapphire increased, the strength of the composition first increased reaching a maximum at about 10 volume percent and then decreased. As shown in FIGS. 3 and 5, the 5 percent sapphire reinforced lead telluride composition behaved as a completely brittle material with a linear stress-strain curve to failure while at higher temperatures, some ductility appeared and the failure stress increased. As shown in FIGS. 4 and 5, the 5% tungsten reinforced lead telluride composition exhibited a considerable plastic strain before failure. The 5% tungsten reinforced lead telluride composition also exhibited a compressive yield stress of about 9300 p.s.i. and a compressive failure stress of about 32,000 p.s.i. at room temperature. Additional strength may be achieved by using fibers with roughened or irregular surfaces to produce greater interface shear strength.

Referring to FIG. 6, the peak of Seebeck coefficient for the p-type unreinforced, sapphire reinforced and tungsten reinforced lead telluride, as shown, is decreased with the fiber reinforced compositions from the peak of the unreinforced material. Using commercial low resistance, highly doped n- and p-type thermoelectric lead telluride with impurity concentrations of about $10^{19}$–$10^{20}$ atoms/cc. which peak at a much higher temperature (sometimes as high as 400° C.), these shifts in peak may be relatively small or nonexistent since the percentage change in doping affects would be insignificant compared to the relatively pure material used in the tests shown in the drawings.

The resistivities of the material are shown in the following table.

| Material: | Resistivity (ohm-cm.) |
|---|---|
| Unreinforced lead telluride | 0.0081 |
| 5% sapphire composition | 0.013 |
| 10% sapphire composition | 0.022 |
| 20% sapphire composition | 0.040 |
| 5% tungsten composition | 0.00527 |

The compositions were further characterized by having an average grain size of about 20 microns while the unreinforced lead telluride had an average grain size of about 68 microns. The density of the compositions and unreinforced lead telluride prepared in accordance with the process described below, ranged from about 96.2% of theoretical for 20% sapphire composition to 99.2% of theoretical for 5% sapphire and 5% tungsten composition to 99.5% theoretical for unreinforced lead telluride.

The thermoelectric elements may be produced or synthesized from 99.999 percent pure lead and tellurium ingots and the desired doping materials, if any. Reaction between the constituents may take place in an appropriate evacuated, closed crucible, such as of graphite or quartz, in an inert gas atmosphere (for instance helium or argon) at about 400° C. followed by homogenization at about 1000° C. (melting point of lead telluride—917° C.). The oxygen in the melt may be limited by shaving the surface of the lead ingots and by maintaining the ingots in as large pieces as possible prior to reaction. After a period of time sufficient to complete the reaction, the crucible may be suitably cooled and the doped or undoped lead telluride removed therefrom. The lead telluride ingot may then be crushed or ground into particles or powder of appropriate size, such as approximately 100 Tyler standard mesh.

The unreinforced lead telluride was made for purposes of this invention using the same process as the reinforced compositions except without the following steps for mixing the fibers and lead telluride particles.

The lead telluride particles may then be mixed with the desired volume percent of appropriate fibers, either sapphire or tungsten, depending on the particular application of the finished thermoelectric element. The particles and fibers may be mixed by any conventional mixing means which will achieve the desired even or uniform dispersion and either random or aligned orientation of the fibers throughout the lead telluride matrix. The determining factor in selecting the mixing procedure used may be the size or length and orientation of the fibers. The fibers and particles may be mixed in a rotary blender or vibrator as dry constituents or as an alcohol slurry and poured into a suitable die. For very long fibers it may be necessary to lay or pour alternate layers of fibers and particles into a die to achieve good dispersion.

The fiber-particle mixture may then be cold depressed within the die to about 70 or 80 percent theoretical density and then hot pressed to near theoretical density. The cold pressing may be performed at pressures of about 2000 p.s.i. The hot pressing process may include a room temperature pump-down to approximately 25 microns of mercury pressure, rapid heating to a temperature from about 650 to 700° C. at a pressure from about 2000 to 5000 p.s.i. for a period of time such as 1 hour depending on the temperature and pressure to achieve high theoretical density and small grain sizes. The thermoelectric material may then be cooled or permitted to cool to room temperature. The cooled material may be used as a thermoelectric element by application of appropriate electrodes to the surface thereof or it may be cut into smaller elements and electrodes applied thereto.

This process may also be used to strengthen other thermoelectric materials such as lead-tin-telluride, bismuth-telluride, alloys of magnesium, germanium and tin and the like. It will be understood that various changes in the details and materials, which have been herein described and illustrated in order to explain the nature of the invention, may be made by those skilled in the art within the principles and scope of the invention as expressed in the appended claims.

What is claimed is:

1. A thermoelectric element comprising lead telluride thermoelectric composition having reinforcement fibers with a Young's modulus of not less than about $60\times10^6$ p.s.i. evenly dispersed therethrough at a volume percent of about 5% to 20% of said composition, the composition having a bend test tensile strength of not less than about 6,000 p.s.i.

2. The element of claim 1 wherein said reinforcement fibers are of sapphire.

3. The element of claim 2 wherein said sapphire fibers are at a volume percent of about 10%.

4. The element of claim 1 wherein said reinforcement fibers are of tungsten.

5. The element of claim 1 wherein said fibers have a length-to-diameter ratio greater than about 50.

References Cited

UNITED STATES PATENTS

| | | | |
|---|---|---|---|
| 3,084,421 | 4/1963 | McDaniels et al. | (75—200(F)UX) |
| 3,218,697 | 11/1965 | Wainer | 29—191.2X |
| 3,337,337 | 8/1967 | Weeton et al. | (75—200(F)UX) |

LELAND A. SEBASTIAN, Primary Examiner

H. E. BEHREND, Assistant Examiner

U.S. Cl. X.R.

29—182.2, 182.5, 191.2; 252—62.3; 136—239